(12) United States Patent
Mai et al.

(10) Patent No.: US 11,481,224 B2
(45) Date of Patent: Oct. 25, 2022

(54) DIGITAL FILTER WITH PROGRAMMABLE IMPULSE RESPONSE FOR DIRECT AMPLITUDE MODULATION AT RADIO FREQUENCY

(71) Applicant: Apple Inc., Cupertino, CA (US)

(72) Inventors: Tao Mai, Santa Clara, CA (US); Robert G. Lorenz, Menlo Park, CA (US); Joachim S. Hammerschmidt, Mountain View, CA (US); Utku Seckin, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 555 days.

(21) Appl. No.: 16/557,357

(22) Filed: Aug. 30, 2019

(65) Prior Publication Data

US 2021/0064380 A1 Mar. 4, 2021

(51) Int. Cl.
| | | |
|---|---|---|
| *G06F 9/38* | (2018.01) | |
| *G06F 9/30* | (2018.01) | |
| *G06F 17/16* | (2006.01) | |
| *G06F 1/08* | (2006.01) | |
| *H03H 17/02* | (2006.01) | |
| *H03H 17/06* | (2006.01) | |

(52) U.S. Cl.
CPC .............. *G06F 9/3895* (2013.01); *G06F 1/08* (2013.01); *G06F 9/30087* (2013.01); *G06F 9/30134* (2013.01); *G06F 17/16* (2013.01); *H03H 17/0248* (2013.01); *H03H 17/06* (2013.01)

(58) Field of Classification Search
CPC .... G06F 9/3895; G06F 9/30087; G06F 17/16; G06F 1/08; G06F 9/30134; G06F 1/04; G06F 1/06; G06F 1/10; G06F 17/15; H03H 17/0248; H03H 17/06
USPC .......................................... 708/420, 300–323
See application file for complete search history.

(56) References Cited

U.S. PATENT DOCUMENTS

| | | |
|---|---|---|
| 4,878,232 A | 10/1989 | Fisher |
| 5,629,955 A | 5/1997 | McDonough |
| 6,477,555 B1 * | 11/2002 | Hartung ................. G06F 17/15 708/607 |
| 7,539,789 B1 | 5/2009 | Ogden |

FOREIGN PATENT DOCUMENTS

EP 0975096 A2 * 1/2000 ............... G06F 1/06

* cited by examiner

*Primary Examiner* — Tan V Mai

(74) *Attorney, Agent, or Firm* — Kowert, Hood, Munyon, Rankin & Goetzel, P.C.; Erik A. Heter; Dean M. Munyon

(57) ABSTRACT

A digital filter according to the disclosure includes a processing circuit having a memory and a number of parallel processing circuits. The parallel processing circuits perform a convolution operations based on input data and function data that is accessed from the memory. The filter further includes a serializer for serializing data that is received from the processing circuits. A clock generator circuit provides a first clock signal to the processing circuit and a second clock signal to the serializer. The frequency of the second clock signal is greater than that of the first clock signal.

20 Claims, 13 Drawing Sheets

DIGITAL FILTER WITH PROGRAMMABLE IMPULSE RESPONSE FOR DIRECT AMPLITUDE MODULATION AT RADIO FREQUENCY

BACKGROUND

Technical Field

This disclosure is directed to communications system, and more particularly, digital filters used in communications systems.

Description of the Related Art

Digital filters are widely used in communications systems. Digital filters perform mathematical operations on discrete time (sampled) signals for the purpose of enhancing or reducing certain aspects of a signal from which the sampled signals are derived. A typical digital filter includes a number of taps and a number mathematical units in which coefficients are applied to the samples. The outputs from the taps may be combined into a summing circuit, which outputs the final response of the filter.

Applications for digital filters include various types of communications system, including high data rate and/or high frequency communications systems. Digital filters may be used in such systems to, on the transmitter side, shape outgoing signals. On the receiver side, digital filters may be used to separate desired incoming signals from undesired noise.

SUMMARY

A digital filter is disclosed. In one embodiment, a digital filter includes a processing circuit having a memory and a number of parallel processing circuits. The parallel processing circuits perform a convolution operations based on input data and function data that is accessed from the memory. The filter further includes a serializer for serializing data that is received from the processing circuits. A clock generator circuit provides a first clock signal to the processing circuit and a second clock signal to the serializer. The frequency of the second clock signal is greater than that of the first clock signal.

In one embodiment, the function data accessed from the memory corresponds to a desired impulse response of the filter. Accordingly, the filter can be programmed for a desired impulse response by placing corresponding information into the memory. The frequency of the second clock signal is a radio frequency (RF) that is an integer multiple of the first frequency. The use of the parallel processing circuits allows for mathematical calculations to be performed by the filter at a significantly lower clock frequency, while serializing at RF allows for outputting the data at the frequency of the carrier.

BRIEF DESCRIPTION OF THE DRAWINGS

The following detailed description makes reference to the accompanying drawings, which are now briefly described.

Figure 1:
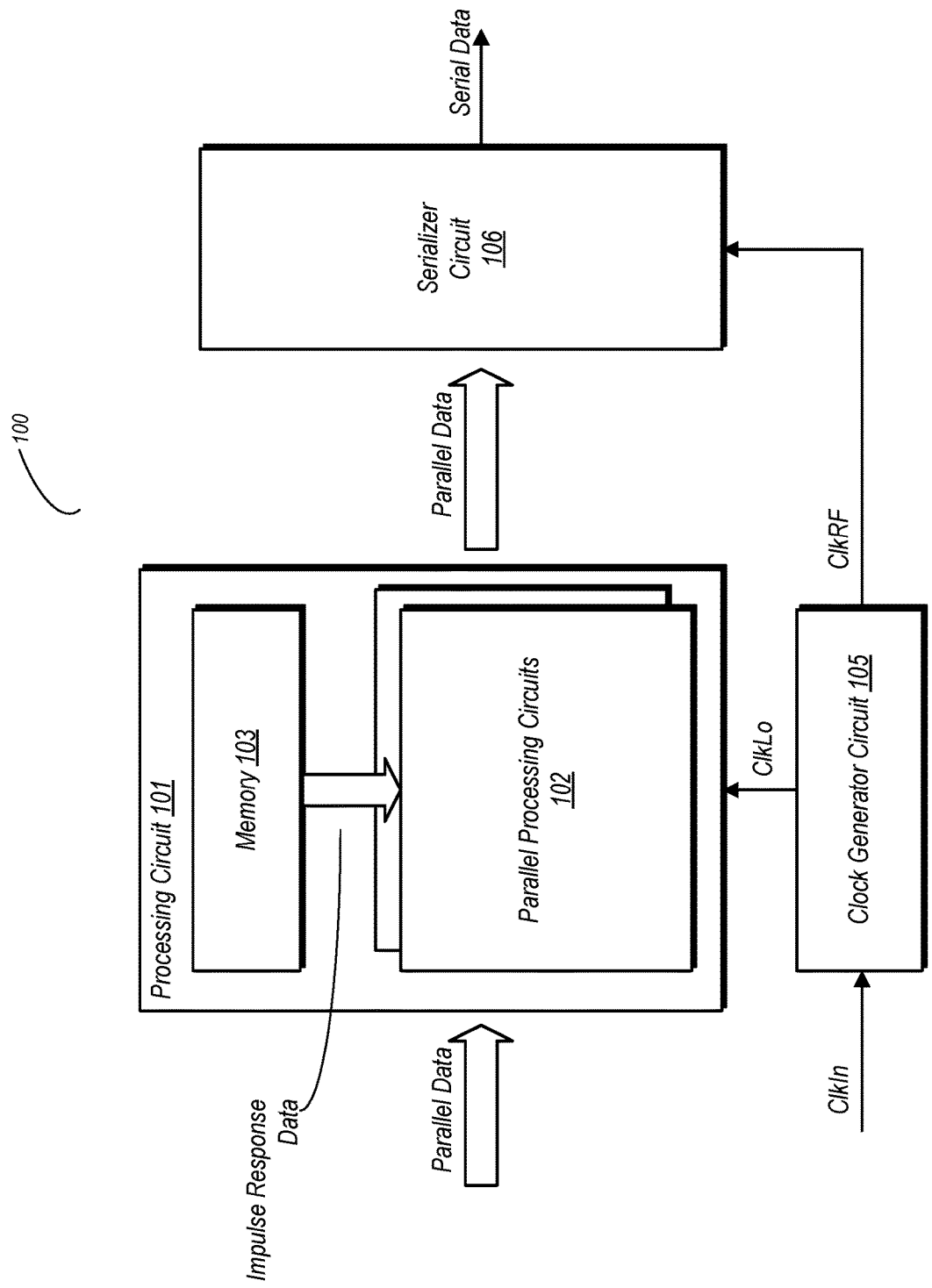
FIG. 1 is a block diagram of one embodiment of a digital filter.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry, that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

The present disclosure is directed to a digital filter capable of outputting data at a data rate corresponding to a radio frequency (RF) of a transmitter while being able to process the data at a lower frequency. In conventional digital filters, data may be serially received and processed (e.g., by combining the incoming data with coefficients) with the resulting output data also provided serially. At higher carrier frequencies (e.g., 6 gHz and up), implementing traditional digital filters becomes more difficult, as the small clock period may not allow sufficient time for digital processing of the data. The present disclosure is directed to various embodiments that overcome the limitations of traditional digital filters.

In one example embodiment, a system implementing a digital filter according to the disclosure has an RF of 8 gHz. The RF is N times the rate at which data is processed, e.g., N=16, with the clock rate at which data is processed being 500 MHz. The filter includes a processing circuit having a memory and a number of parallel processing circuits for implementing the math functionality of the filter. The incoming data is processed in N (e.g., 16) parallel processing circuits, with the output of these circuits being serialized and conveyed from the filter at the RF of 8 gHz. Processing the data in parallel at the lower frequency allows sufficient time to perform the desired mathematical operations, while outputting the data at the RF allows it to be modulated (e.g., amplitude modulated) as the carrier frequency of a transmitter in which the digital filter is implemented.

The number of parallel processing circuits used at a given time may be adjustable in some embodiments. For example, for an RF of 6.5 gHz, N=13, and thus the data may be processed in 13 of the parallel processing circuits, at 500 MHz, rather than utilizing all 16 as in the previous example. More generally, the number of parallel processing circuits is selectable according to a desired RF (which may correspond to a desired channel), the number of available parallel processing circuits, and the clock frequency at which data is processed in the parallel processing circuits.

The processing circuit in various embodiments receives ternary data, with the parallel processing circuits performing a convolution operation. The convolution operation is performed on the ternary data and an impulse response function stored in memory. Since any desired impulse response function can be input into the memory, the impulse response function is thus programmable. Utilizing a fully programmable impulse response function, the filter may, when implemented in a transmitter, reduce or eliminate analog circuit non-idealities that can degrade transmitter performance, with any non-idealities in the transmitter being localized only to a power amplifier.

As noted above, a convolution operation is performed across a number of parallel processing circuits. Data may be input into the parallel processing circuits at the lower frequency discussed above, e.g., the 500 MHz frequency as discussed above. The ternary input data may be provided in vectors that are a number of symbols in length. The parallel processing circuits may perform the convolution operation by conducting a dot-product operation between the impulse response function and the vectors to generate output samples.

The output of the processing circuit (e.g., the results of the convolution operations performed by the parallel processing circuits) is serialized data that is a modulation code. This code may be forwarded to a power amplifier such a switching power amplifier. This as the effect of applying direct amplitude modulation, at RF, in the switching power amplifier of a transmitter in which the digital filter may be implemented. Various details of the disclosed filter and an example system in which it may operate are now discussed with reference to FIGS. 1-13.

FIG. 1 is a block diagram of one embodiment of a digital filter. In the embodiment shown, digital filter 100 includes a processing circuit 101, a clock generator circuit 105, and a serialize circuit 106. Processing circuit 101 also includes parallel processing circuits 102, which include a number of identical units that process information in parallel.

In the embodiment shown, data is provided to processing circuit 101 as parallel data. The data, which in one embodiment is ternary data, is distributed among the various ones of the parallel processing circuits 102. Memory 103 in the embodiment shown may store data corresponding to a filter impulse response function. During operation, the impulse function data is provided to the parallel processing circuits 102. In one embodiment, the parallel processing circuits 102 perform a convolution operation using the impulse response function accessed from memory 103 and the incoming data.

After performing the convolution operation, data is output from processing circuit 101, as parallel data, to serializer circuit 106. Serializer circuit 106 converts the data into a serial format for output therefrom. The data may then be conveyed to, e.g., power amplifier. For example, when filter 100 is implemented in a transmitter, the serial data output from serializer circuit 106 is modulation code that is provided to a switching power amplifier, where it can be amplitude modulated for wireless transmission.

Clock generator circuit 105 in the embodiment shown receives an input clock signal, ClkIn, and provides two output clock signals. A first of the output clock signals, ClkLo, is provided to processing circuit 101. A second clock signal, ClkRF, is provided to serializer circuit 106. In some embodiments, ClkIn and ClkRf may have the same frequency, while ClkLo is produced by dividing ClkIn. Parallel data is transferred into processing circuit 101 at the clock rate of ClkLo. Serial data is transferred out of serializer circuit 106 at a clock rate of ClkRf. In various embodiments, the frequency of ClkRf is N times that of ClkLo, where N is an integer value indicative of the number of parallel processing circuits 102 involved in performing the convolution operation. For example, in one embodiment, ClkLo is 500 MHz, N=16, and thus ClkRf is 8 gHz. As previously noted, the number of parallel processing circuits 102 that are active during operation can vary depending on, e.g., a selected channel or mode of operation. Thus, even if a full 16 parallel processing circuits 102 are available, if N<16 (assuming that is the maximum number available), then the frequency of ClkRf may be less than 800 MHz. For example, if N=13 and ClkLo is 500 MHz, ClkRf is 6.5 gHz.

Providing the data in parallel, at the lower clock frequency of ClkLo, and processing the data in parallel may allow for sufficient time to perform all of the desired computations. Thereafter, serializer circuit 106 may select and output the data as serial data at the frequency of ClkRf, thereby enabling the data to be provided at the data rate of the desired carrier frequency. This operation may thus eliminate the need for modulation at a lower frequency with subsequent up-conversion using a mixer and a local oscillator.

Figure 2:
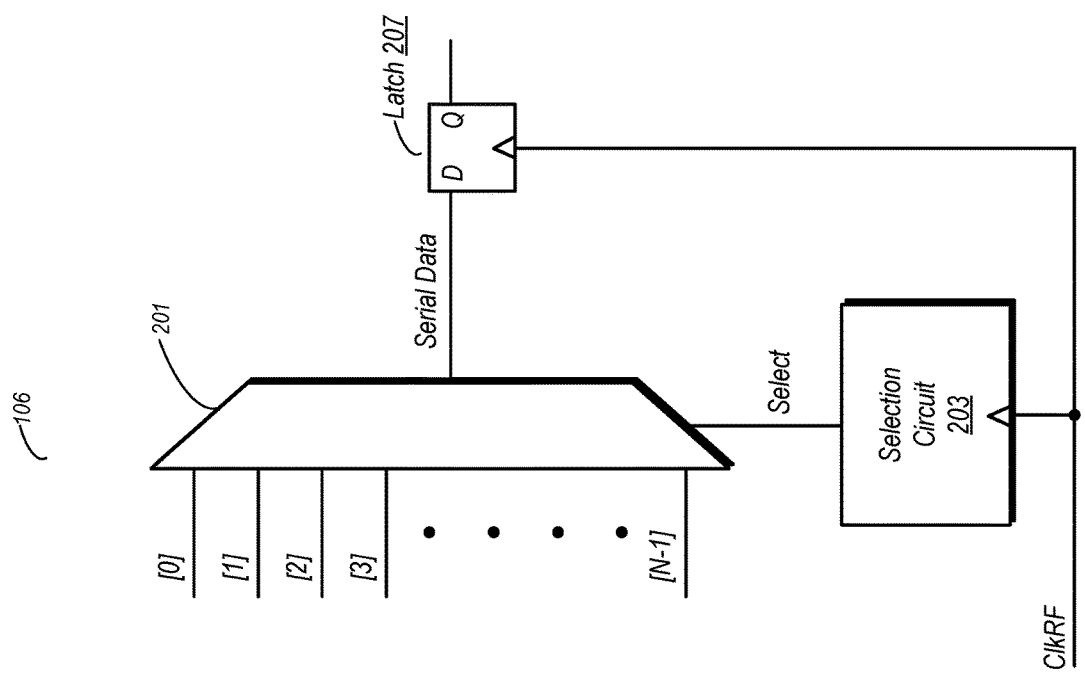
FIG. 2 is a diagram of one embodiment of a serializer circuit.

FIG. 2 is a diagram of one embodiment of a serializer circuit. In the embodiment shown, serializer circuit 106 includes a multiplexer 201, a selection circuit 203, and a latch 207 coupled to the output of multiplexer 201. Selection circuit 203 and latch 207 each operate at a clock rate of ClkRf.

In the embodiment shown, multiplexer 201 is a one-hot multiplexer having N inputs, one of which is selected at any given time in accordance with one or more selection signals output from selection circuit 203. Furthermore, selection circuit 203 may cycle through selection of the various inputs of in a sequence, e.g., beginning with input [0], to input [1], then to input [2], and so on. Selection circuit 203 may, in accordance with the input clock signal, advance the selection at the frequency of ClkRf. Selected data is output from multiplexer 201 to latch 207, which synchronizes the serial data to ClkRf.

Figure 3:
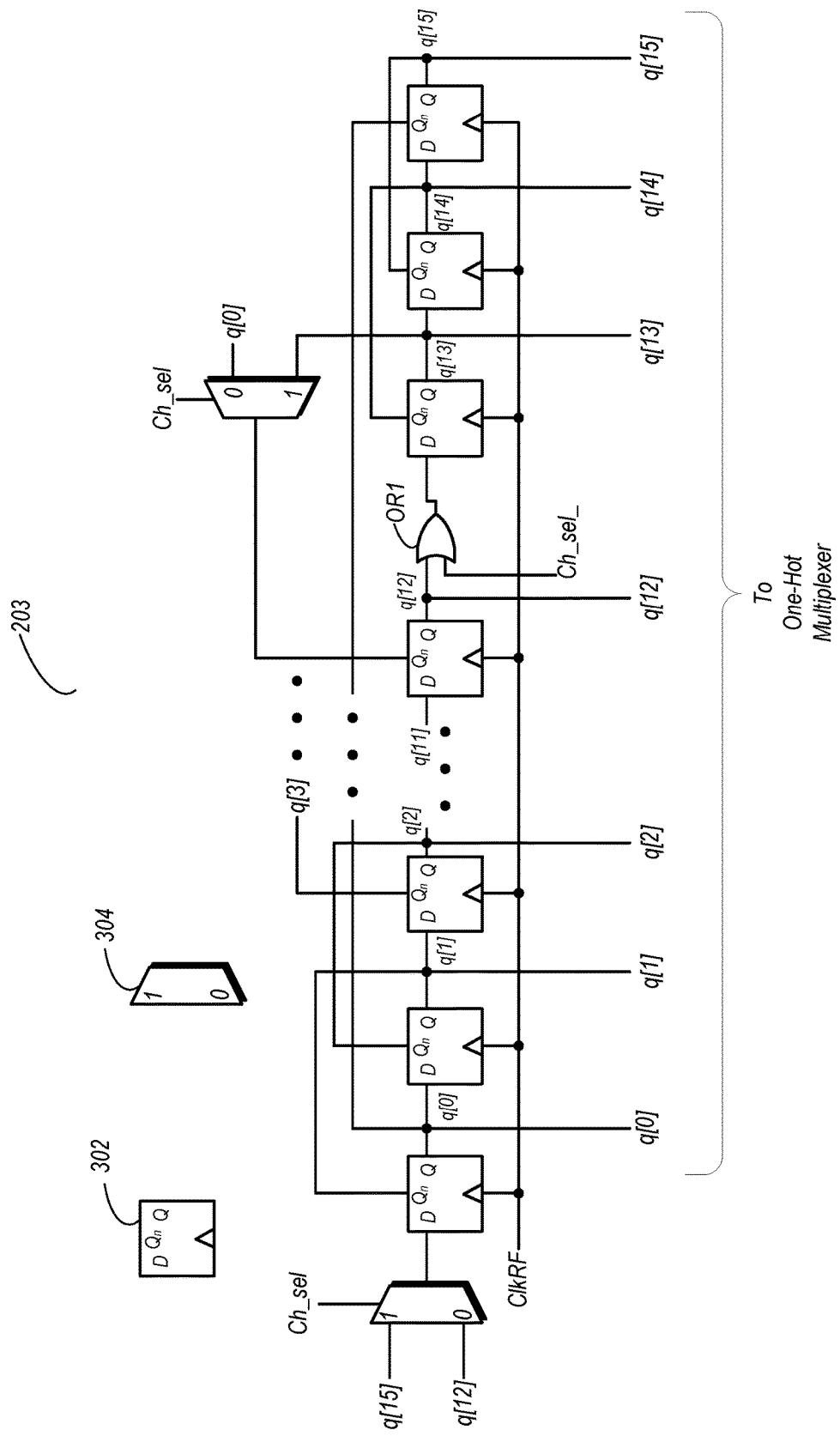
FIG. 3 is a diagram of one embodiment of a selection circuit used with a serializer circuit.

One embodiment of a selection circuit 203 is shown in FIG. 3. In the embodiment shown, selection circuit 203 is an integer divider that includes a number of latches 302 coupled in serial, a pair of multiplexers 304, and an OR gate. The latches 302 in the embodiment shown are true-single-phase-clock dynamic latch units. Selection circuit 203 in this embodiment is arranged in accordance with the examples discussed above, and may select one of thirteen or sixteen inputs, depending on the selected channel. The selected channel may be in accordance with a channel select signal, Ch_Sel, which can, depending on its state, cause one of thirteen (q[0]-q[12]) or one of sixteen (q[0]-q[15]) to be provided to one hot-multiplexer 201 at a given time.

A first instance of a two-to-one multiplexer 304 is coupled to receive an input signal to initiate operation of selection circuit 203 in accordance with the selected channel. In this particular embodiment, a selection signal is considered asserted when in a logic low state. The logic low state may propagate from one latch 302 to the next at a rate corresponding to the frequency of the clock signal ClkRf. The remainder of the latches may output a logic high while the selected one outputs a logic low to a corresponding switch in one-hot multiplexer 201. Furthermore, the output of each latch is fed back to the $Q_n$ input of a previous latch in the sequence. This arrangement may ensure that when one latch outputs a logic low, the previous latch in the sequence is held to a logic high. Accordingly, the circuit as shown here is arranged to guarantee that the output of only one latch at a given time is low (which is an asserted one-hot select signal in this embodiment).

As noted above, the embodiment of selection circuit 203 shown here is configurable for different communications channels, one which utilizes thirteen parallel processing circuits 102 and another utilizing sixteen parallel processing circuits 102. When the channel select signal, Ch_Sel is a logic 1, the q[15] signal is fed back through the multiplexer 304, at the far left of the drawing, while the q[13] output is fed back through the other multiplexer to the latch 302 that produces the q[12] output. Meanwhile, when Ch_Sel is a logic 1, its complement, Ch_Sel, is provided to OR gate OR1, and thus the output of this logic gate is the state of q[12] at any given time. When Ch_Sel is a logic 0, the q[12] output is provided through the multiplexer 304 at the far left of the drawing is fed through to the first latch 302, while q[0] is fed to the $Q_n$ input of the latch that produces q[12]. Since Ch_Sel is a logic 1 in this configuration, the input to the last three latches in the series (as the right hand side of the drawing) is always a logic 1, irrespective of the output q[12].

While the arrangement shown here is arranged to select between two specific configurations, selection circuit 203 is not limited in this manner in accordance with this disclosure. The number of latches as well as the number of different configurations (e.g., channels) can vary from one embodiment to another while remaining within the scope of this disclosure.

Figure 4:
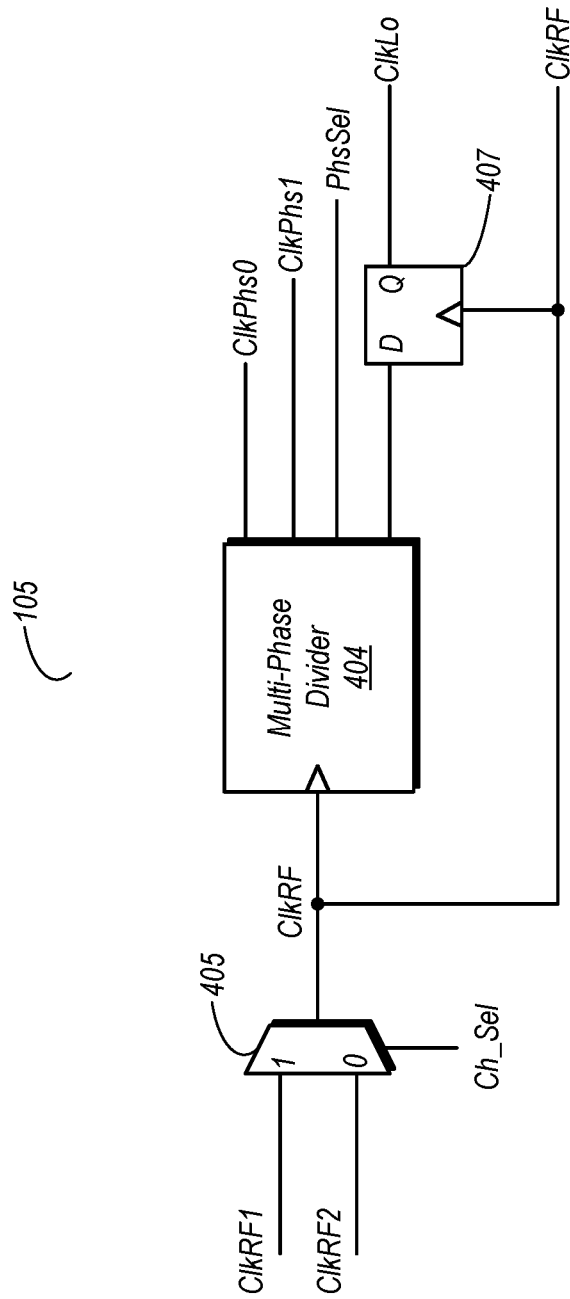
FIG. 4 is a diagram illustrating one embodiment of a clock generation circuit.

FIG. 4 is a diagram illustrating one embodiment of a clock generation circuit. In the embodiment shown, clock divider 400 includes a multiplexer 405 used to select an input clock signal, a multi-phase clock divider 404, and a latch 407.

Multiplexer 405 in the embodiment shown may select one of two received input clock signals, ClkRF1 or ClkRF2. In one embodiment, these clock signals are generated by corresponding local oscillators coupled to multiplexer 405. Other types of clock generation circuitry may be used in other embodiments. Depending on the state of the channel select signal, Ch_Sel, the selected input clock signal is output from multiplexer 405 as the ClkRF signal. The ClkRF signal is fed to respective clock inputs of multiphase divider 404 as well as to latch 407.

Multi-phase clock divider 404 in the embodiment shown includes clock divider circuitry to produce four different output signals. Two of the output signals are ClkPhs0 and ClkPhs1. These two clock signals are opposite in phase with respect to one another, but otherwise have the same frequency. The frequency of these clock signals may be one half that of the ClkLo signal (e.g., when ClkLo is 500 MHz, ClkPhs0 and ClkPhs1 are each 250 MHz). Multiphase clock divider 404 also outputs a phase select signal, PhsSel. This signal is used in conjunction with ClkPhs0 and ClkPhs1, as will be discussed below in reference to FIG. 5.

Multi-phase clock divider 404 also outputs a clock signal to the data ('D') input of latch 407, which in turn outputs the ClkLo signal. Both the input and output of latch 407 have the same frequency. Providing this clock signal to latch 407 may synchronize edges thereof with those of ClkRF.

Figure 5:
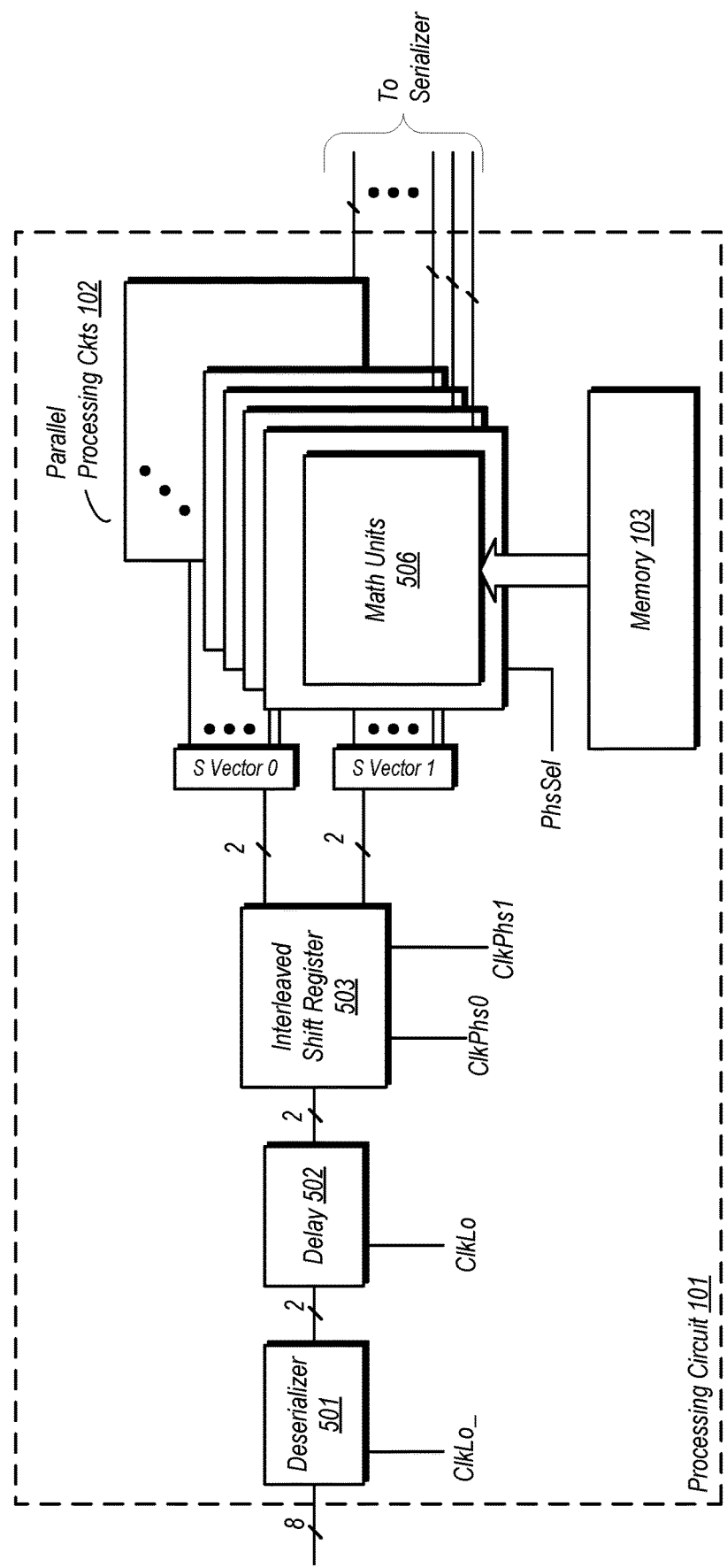
FIG. 5 is a block diagram of one embodiment of a processing circuit.

FIG. 5 is a block diagram of one embodiment of a processing circuit. In the embodiment shown, processing circuit 101 includes a deserializer 501, a delay circuit 502, an interleaved shift register 503, a number of parallel processing circuit 102, and a memory 103. A pair of symbol vector registers (S Vector 0 and S Vector 1) are coupled between interleaved shift register 503 and the parallel processing circuits 102. Each of the parallel processing circuits 102 each include a math unit 506.

In the embodiment shown, incoming data is received as 8-bit data, although the number of bits may vary from one embodiment to the next. Deserializer 501 converts this parallel data into serially transmitted ternary data having two bits, a sign bit and a magnitude bit. Deserializer 501 outputs the ternary data at a data rate corresponding to the frequency of ClkLo. In this embodiment, deserializer 501 receives the complement of ClkLo, ClkLo. The ternary data is then provided to delay unit 502, which applies a delay to the ternary data and outputs the same in accordance with the ClkLo signal. Interleaved shift register 503 then provides ternary data to the symbol vector registers. Both S Vector 0 and S Vector 1 receive data at a clock rate according to the clock signals ClkPhs0 and ClkPhs1, both of which have the same frequency. As noted above, in one embodiment both ClkPhs0 and ClkPhs1 have a frequency of 250 MHz while being opposite in phase to one another. Accordingly, interleaved shift register 503 outputs ternary data at an effective data rate of 500 MHz.

Data is provided from the symbol vector registers to the parallel processing circuits 102 in accordance with the phase select signal, PhsSel. The phase select signal is effectively a clock signal having one half the frequency of ClkLo. Accordingly, data is alternately selected from the shift vector registers, with each shift vector register effectively outputting data to the parallel processing circuits at an effective data rate of the ClkPhs0 and ClkPhs1 signals. As a result, data evaluation time for each symbol vector may be the full period of that of ClkLo, while still enabling the overall data rate to also be equivalent to the frequency of ClkLo. By inputting data in this manner, timing constraints may be looser, while power consumption may also be reduced. Absent this implementation, the evaluation time for each symbol vector would be one half the period of ClkLo. After inputting the data, the various math operations discussed above are performed, with the resulting outputs provided to the serializer circuit 106. These math operations will be discussed in further detail with reference to FIGS. 6-10.

Figure 6:
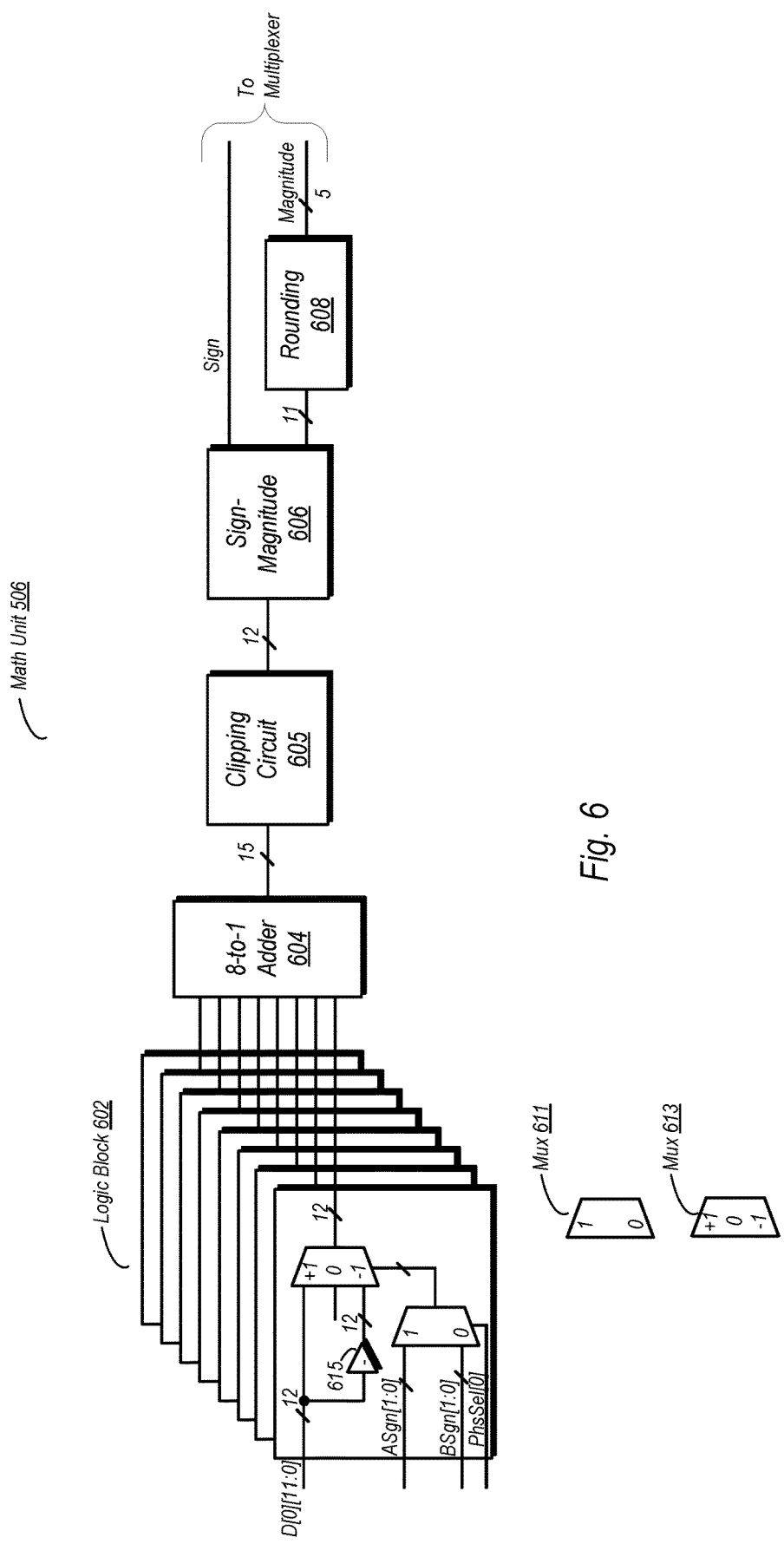
FIG. 6 is a block diagram of one embodiment of circuitry implementing a math unit within a parallel processing circuit.

FIG. 6 is a block diagram of one embodiment of circuitry implementing a math unit within one of the parallel processing circuits 102. In the embodiment shown, math unit 506 includes a number of logic blocks 602 (eight in this particular embodiment), an 8-to-1 adder circuit 604, a clipping circuit 605, a sign-magnitude circuit 606, and a rounding circuit 608. One notable feature of math unit 506 is that it is implemented in its entirety using combinational logic, and thus does not include any flip-flops or other sequential circuitry. Implementation of math unit 506 using solely combinational logic may allow for reduced power consumption, particularly in light of the fact that there is no clock signal provided to circuitry thereof to consume dynamic power. Additionally, the absence of sequential circuitry within math unit 506 may significantly reduce timing constraints.

Each logic block 602 in the embodiment shown includes a multiplexer 611 (2-to-1) and a multiplexer 613 (3-to-1) and is coupled to receive the initial input data. In this particular example, there are eight logic blocks, and hence eight data values can be received by and operated on by math unit 605 at a given time. However, this number is not intended to be limiting, and thus can vary from one embodiment to the next. The logic blocks 602 may receive input data from one of the vector registers previously discussed with reference to FIG. 5, in accordance with a phase select signal. In the embodiment shown, a phase select signal, PhsSel[0], is provided to a first one of the logic blocks (a corresponding phase select signal is provided to each of the remaining logic blocks 602). The phase select signal causes the corresponding multiplexer 611 to select two-bit ternary data (one sign bit and one magnitude bit) from one of the two symbol vector registers. The output of multiplexer 611, from the selected input thereto, is provided as select signals to multiplexer 613. The inputs to this latter multiplexer comprises, in this embodiment, 12-bit data corresponding to an impulse response function stored in the memory. Based on the selection signals, multiplexer 613 outputs one of either the original input data (D[11:0] in this case), a complement of the data (pass through inverter 615), or zero. The output from multiplexer 311 is thus addend portion of a dot product that is generated as part of the convolution operation performed in math unit 506.

The output of each logic block 602 is provides to 8-to-1 adder 604 (hereinafter 'adder 604'). In adder 604, each of the addends output from corresponding ones of the logic blocks 602 are summed to generate a dot product. The sum that is output from adder 604 is, in this embodiment, a 15-bit value that is provided to clipping circuit 605. In clipping circuit 605, this value is reduced to 12 bits. In this embodiment, clipping comprises removing the three most significant bits of the received value. The programming of the impulse response may be performed such that removing the most significant bits does not degrade the overall performance of the filter.

The output of clipping circuit 605 in the embodiment shown it provided to sign-magnitude circuit 606. In this circuit block, the sign bit is separated from the remaining bits which correspond to the magnitude of the dot product. The sign bit is then output unaltered, while the remaining magnitude bits are provided to a rounding circuit 608. In the embodiment shown, rounding circuit 608 may round the dot product produced in math unit 506 by truncating the six least significant bits. Thereafter, the remaining portion of the magnitude value is provided, along with the sign bit, to multiplexer 201 for implementing the serialization process.

Figure 7:
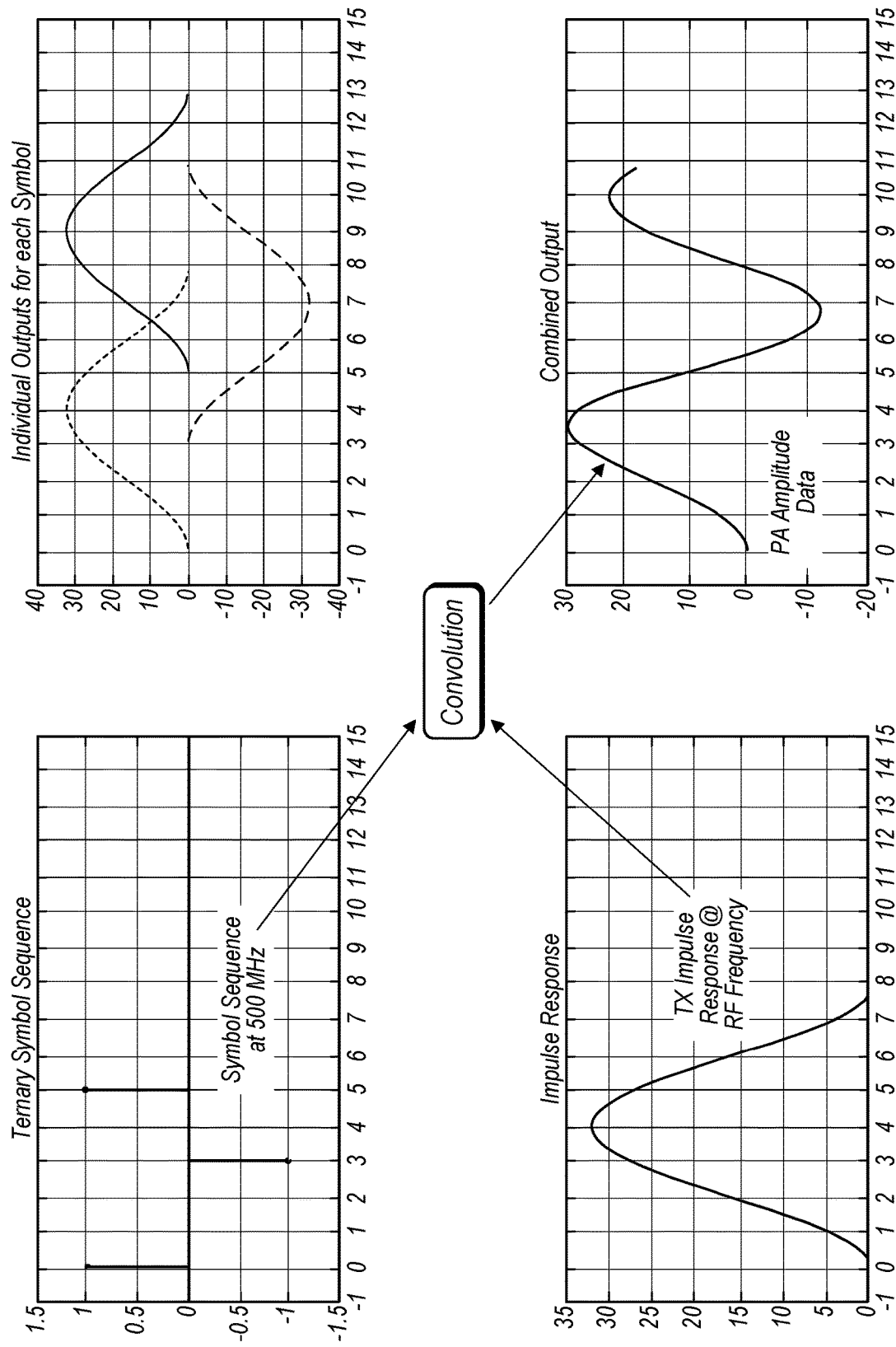
FIG. 7 is a graphic illustration of a convolution operation performed by one embodiment of a parallel processing circuit.
Figure 8:
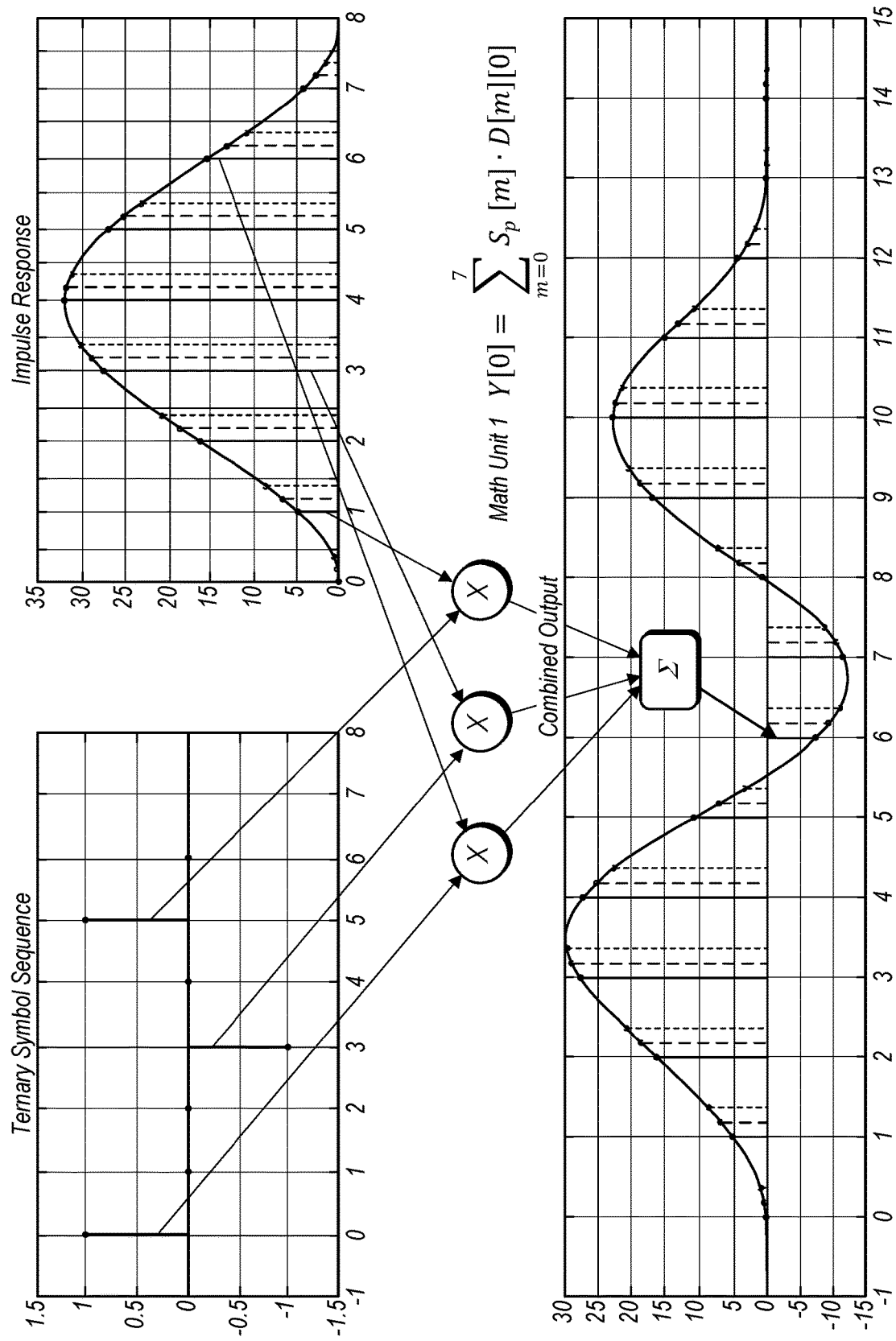
FIG. 8 further illustrates a convolution operation performed by one embodiment of a parallel processing circuit.
Figure 9:
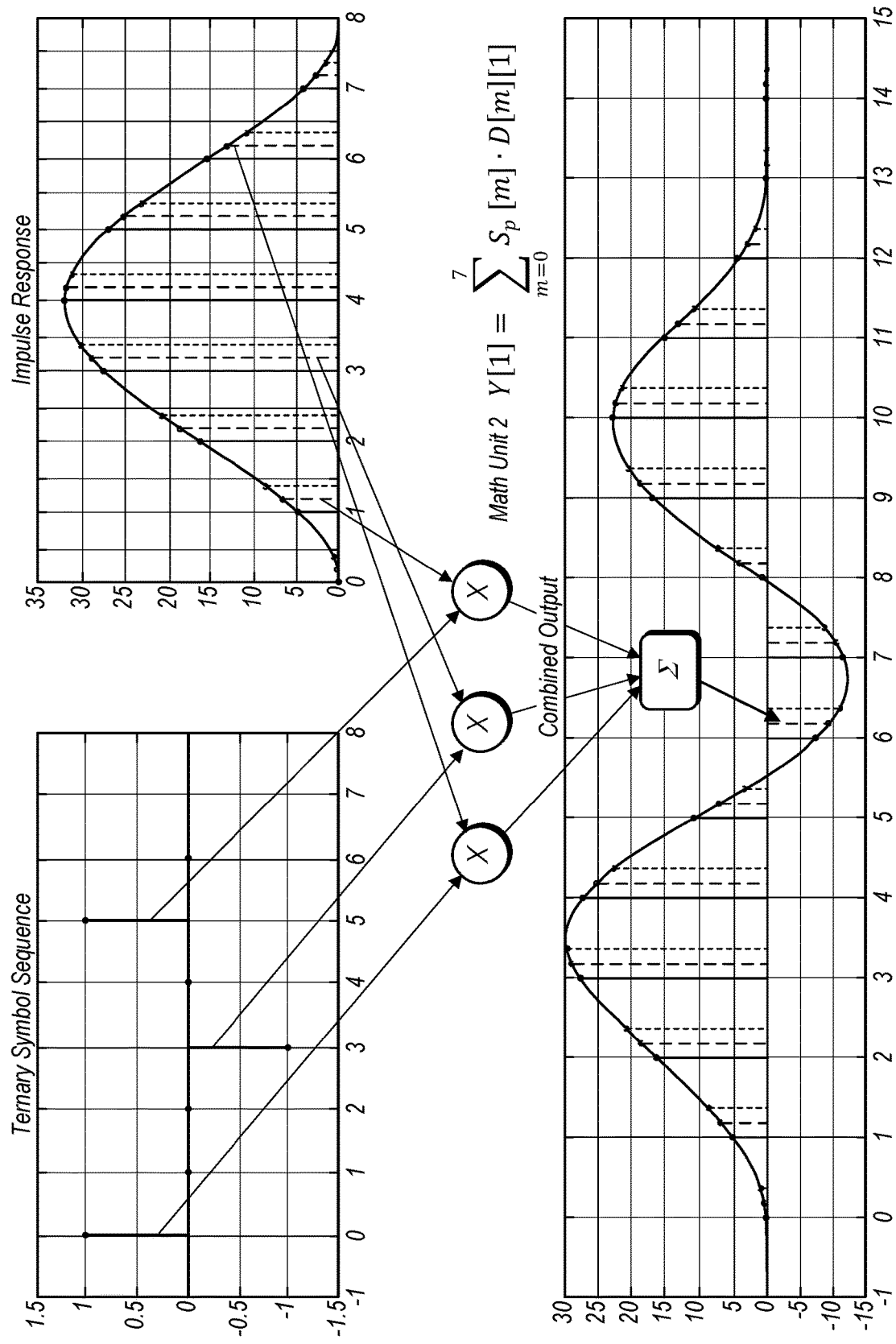
FIG. 9 further illustrates a convolution operation performed by one embodiment of a parallel processing circuit.
Figure 10:
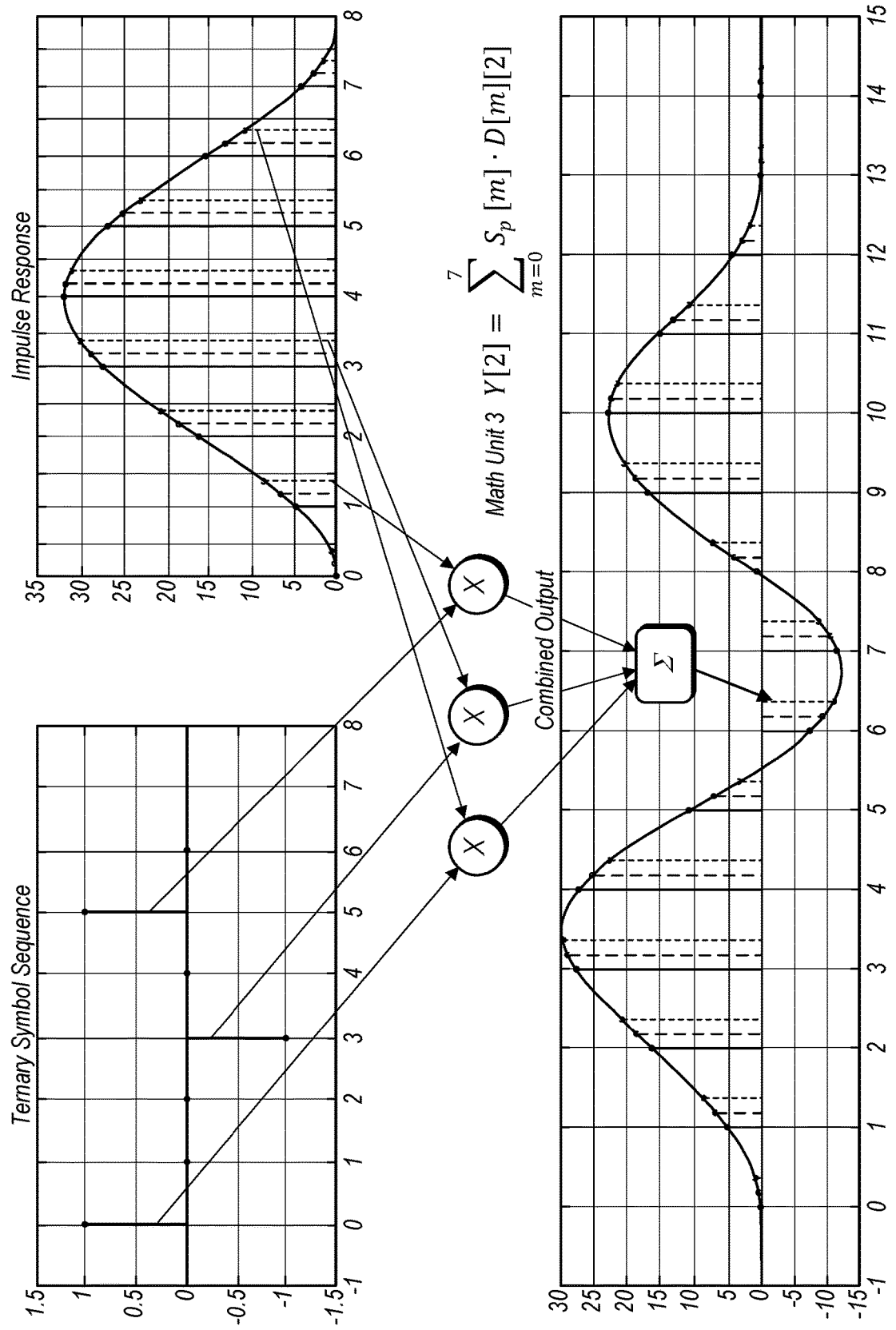
FIG. 10 further illustrates a convolution operation performed by one embodiment of a parallel processing circuit.

FIG. 7-10 graphically illustrate the process of convolution performed in each math unit 506 of the parallel processing circuits 102. The overall convolution process is shown in FIG. 7, while example portions of the convolution is shown in FIGS. 8-10.

In FIG. 7, ternary data of a ternary symbol sequence (upper left) is convolved with an impulse response (lower left right), stored in memory, to produce combined output (lower right) that forms power amplitude data, or modulation code, that is provided to a power amplifier. The combined output response is formed using the individual output responses as shown in the upper right portion of the drawing. These individual output responses are produced by combining the individual pieces of ternary data with the impulse response. As shown in the drawing, one portion of the ternary data is negative, and thus the individual output response is also negative. Since the other two portions of ternary data in this example are positive, their individual outputs are also positive.

The convolution process is illustrated in further detail with regard to FIGS. 8-10. In this illustration, the multipliers (circles having an 'X' therein) are representative of the logic blocks 602 of FIG. 6, while the Σ block represents the adder. In FIG. 8, three data points of the ternary symbol sequence are combined with corresponding portions of the impulse response function, in the multipliers, with the resulting products correspondingly summed together. This produces a resulting portion of the convolution operation as shown. Similarly, in FIGS. 9 and 10, the same three data points of the ternary symbol are combined with subsequent portions of the impulse response to form subsequent resulting portions of the convolution operation. Generally speaking, a given ternary data symbol is combined in the manner shown in FIGS. 8-10 with each portion of the impulse response to form the overall combined output of the convolution response. Accordingly, the output wave shown in the lower portion of each of FIGS. 8-10 is the overall result of the convolution performed in each of the parallel processing circuits 102. More particularly, each individual one of the parallel processing circuits 102 performs a convolution operation similar to the one illustrated in FIGS. 7-10, and this performs the basis for the modulation code that is output at RF from digital filter 100.

Figure 11:
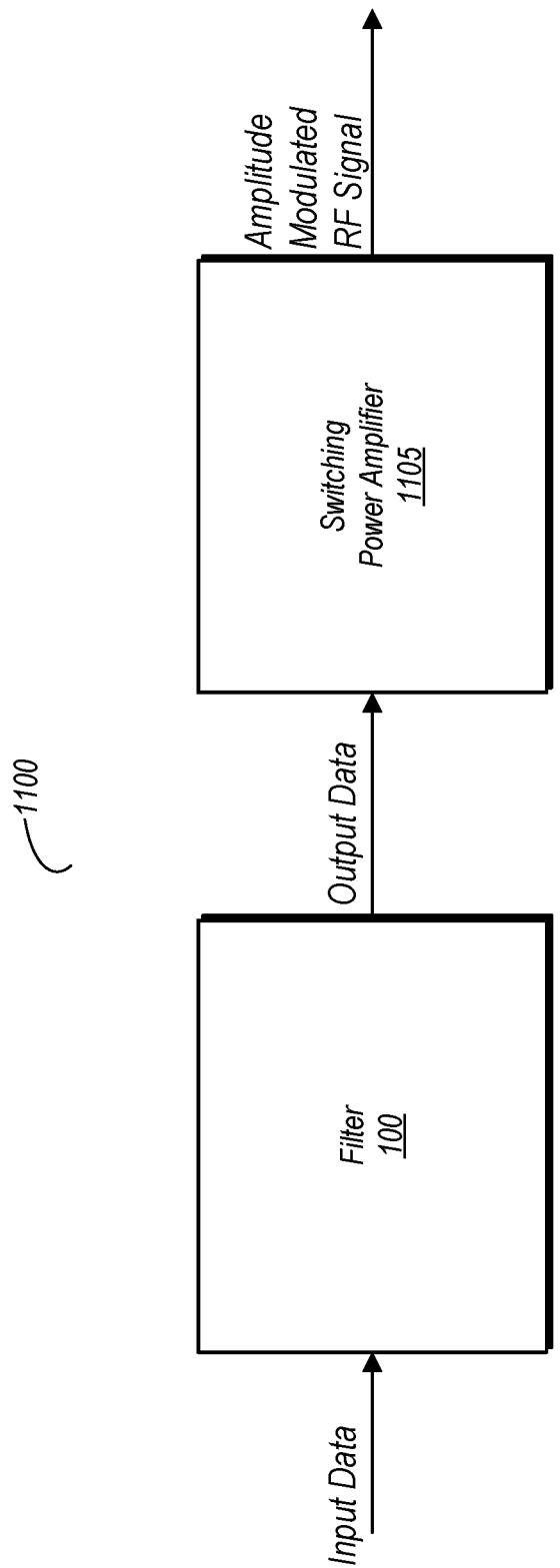
FIG. 11 is a block diagram of one embodiment of a transmitter circuit having a filter and a power amplifier.

FIG. 11 is a block diagram of one embodiment of a transmitter circuit having a filter and a power amplifier. In the embodiment shown, transmitter circuit 1100 includes a filter 100 and a switching power amplifier 1105. Filter 100 may be an embodiment of the filter disclosed herein, and may thus include the various circuits described above in FIGS. 1-6, and perform the operations of those circuits as well as the math operations illustrated in FIGS. 7-10. The output data provided form filter 100 is modulation code that is transferred at a data rate corresponding to the RF of transmitter 1100.

Switching power amplifier 1105 in the embodiment shown may be of any suitable implementation. Switching may occur at the rate of the RF signal. When receiving the modulation code and switching the carrier frequency, switching power amplifier performs direct amplitude modulation at the RF. Accordingly, the output signal is an amplitude modulated signal based on the modulation code provided to switching power amplifier 1105. The output signal may then be provided to, e.g., an antenna for wireless transmission.

Figure 12:
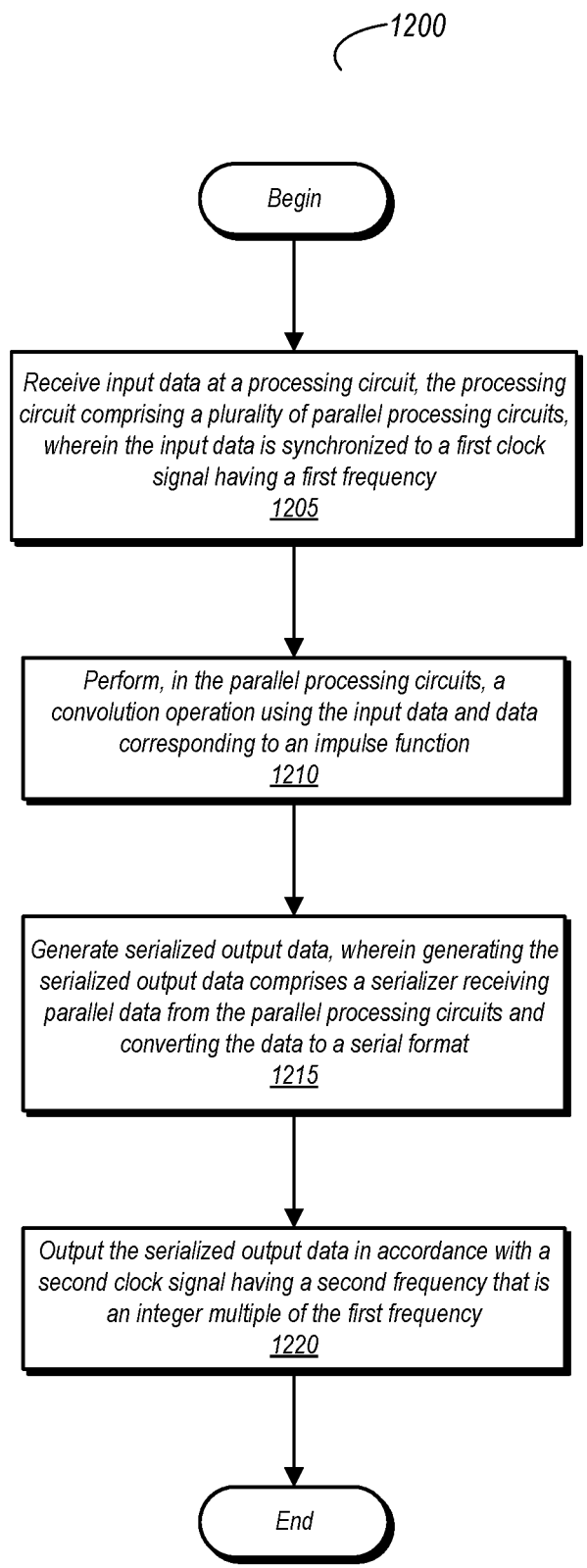
FIG. 12 is a flow diagram of one embodiment of a method for operating a filter.

FIG. 12 is a flow diagram illustrating one embodiment of a method for operating a filter. Method 1200 as illustrated in FIG. 12 may be performed using various embodiments of the hardware discussed above. Other apparatus embodiments implemented using circuitry not explicitly discussed herein may also be capable of performing method 1200, and may thus fall within the scope of this disclosure.

Method 1200 begins with receiving input data at a processing circuit, the processing circuit comprising a plurality of parallel processing circuits, wherein the input data is synchronized to a first clock signal having a first frequency (block 1205). Upon receiving the data, the method further includes performing, in the parallel processing circuits, a convolution operation using the input data and data corresponding to an impulse function (block 1210). The method further includes generating serialized output data, wherein generating the serialized output data comprises a serializer receiving parallel data from the parallel processing circuits and converting the data to a serial format (block 1215). After serializing, the method includes outputting the serialized output data in accordance with a second clock signal having a second frequency that is an integer multiple of the first frequency (block 1220).

In various embodiments, generating serialized output data includes a one-hot multiplexer selecting outputs from the parallel processing circuits. Selecting the outputs includes a selection circuit causing the one-hot multiplexer to select output from the parallel processing circuits sequentially.

Receiving the input data comprises receiving ternary data symbols at a data rate corresponding to the first clock frequency. Performing the convolution operation comprises performing a dot product between each ternary data symbol and the impulse function.

With regard to the frequencies of the clock signals used, the second frequency is a radio frequency for a carrier signal used to wirelessly transmit the serialized output data. Furthermore, the second frequency is an integer multiple of the first frequency. The method also includes providing, at the radio frequency, the serialized data to a power amplifier. Using the power amplifier, the method includes generating an amplitude modulated signal using the serialized data and subsequently wirelessly transmitting the amplitude modulated signal.

Figure 13:
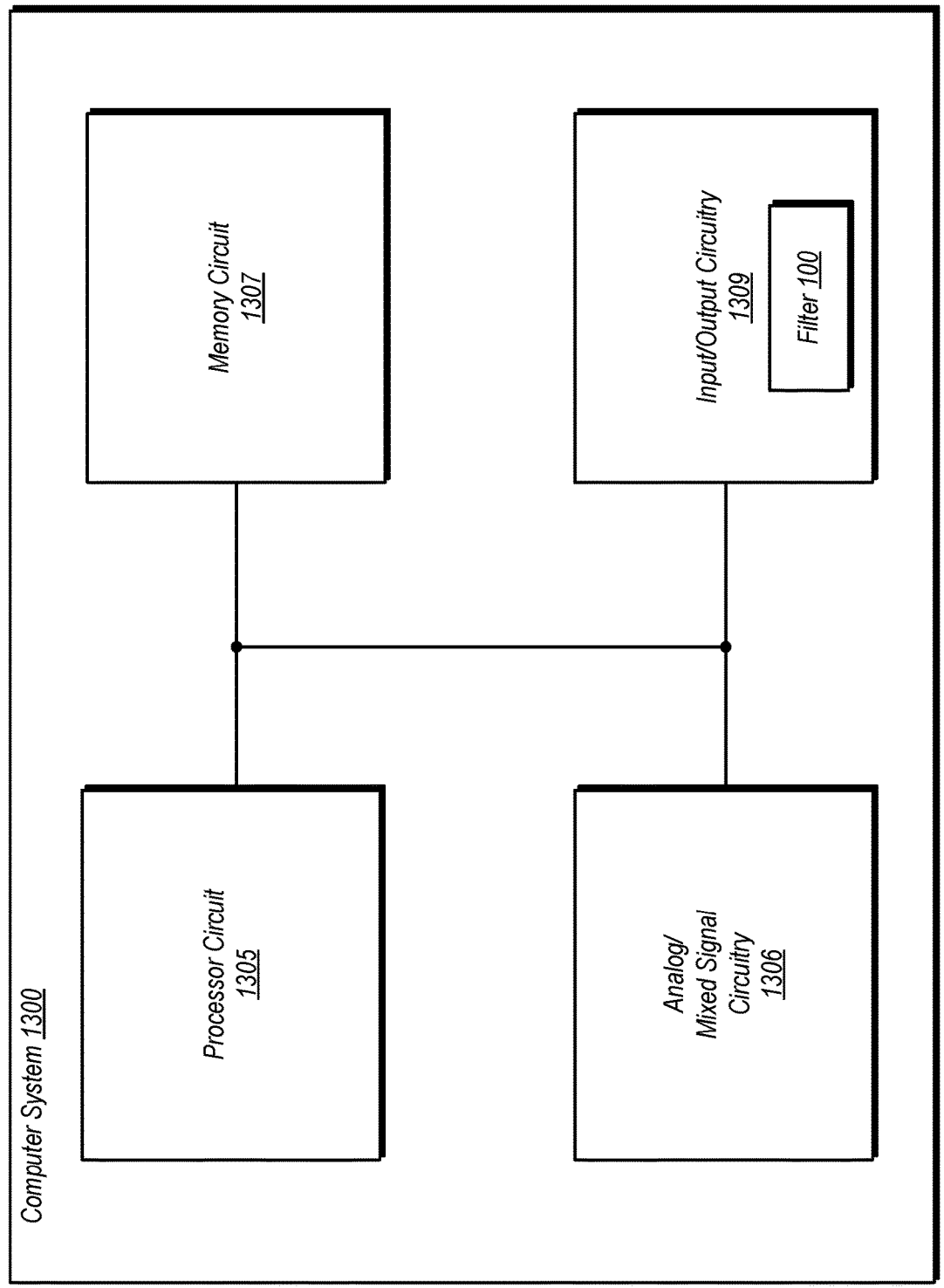
FIG. 13 is a block diagram of one embodiment of a computer system.

FIG. 13 is a block diagram of one embodiment an example computer system. Computer system 1300 in the embodiment shown includes a processor circuit 1305, analog/mixed signal circuitry 1306, memory circuit 1307, and input/output circuitry 1309. Input/output circuitry 1309 includes an embodiment of filter 100 which falls within the scope of any of the various embodiments of the same discussed above.

Processor circuit 1305 may be one of a number of different types of processors, e.g., a heterogeneous multi-core processor. In various embodiments, processor cores in processor circuit 1305 may include cores optimized for performance, power consumption, or particular types of processing functions.

Memory circuit 1307 may be one or more of a number of different types of memory, including random access memory (dynamic and/or static), graphics memory, flash memory, disk storage, and so on. Generally speaking, memory circuit 1307 may implement any type of memory technology that allows for persistent storage of information.

Analog/mixed signal circuitry 1306 may include a number of different types of circuits that include at least some analog functionality. Such circuits may include power supply circuits, such as voltage regulators used to provide supply voltages to other circuits within computer system 1300. Metrology circuitry used to measure various circuit/performance parameters may also be included. Power management circuits may also be included in analog/mixed signal circuitry, and may implement functions to control power consumption and temperature in various parts of computer system 1300.

Input/output circuitry 1309 includes various circuits for conveying information to destinations external to computer system 1300, as well as for receiving information from external sources. This may include circuitry for outputting information to a display, audio information, and so on. Input/output circuitry 1309 may also include wireless communications circuitry, some of which may implement an embodiment of filter 100 as discussed herein.

Numerous variations and modifications will become apparent to those skilled in the art once the above disclosure is fully appreciated. It is intended that the following claims be interpreted to embrace all such variations and modifications.

What is claimed is:

1. An apparatus, comprising:
   a processing circuit, the processing circuit including a memory circuit and a plurality of parallel processing circuits configured to process data in parallel with one another, wherein the parallel processing circuits are configured to perform a convolution operation based on input data and function data accessed from the memory;
   a serializer circuit configured to serialize data provided from the processing circuit; and
   a clock generator circuit configured to provide a first clock signal having a first frequency to the processing circuit and configured to provide a second clock signal having a second frequency to the serializer circuit, wherein the second frequency is greater than the first frequency.

2. The apparatus of claim 1, wherein the second frequency is a radio frequency at which serialized data output from the serializer is wirelessly transmitted, and wherein the second frequency is a multiple of the first frequency.

3. The apparatus of claim 1, wherein the parallel processing circuits are implemented exclusively with combinational logic circuitry.

4. The apparatus of claim 1, wherein the serializer includes a one-hot multiplexer coupled to each of the parallel processing circuits, and further includes a selection circuit configured to cause the one-hot multiplexer to sequentially select ones of the parallel processing circuits for output.

5. The apparatus of claim 4, wherein the selection circuit comprises an integer divider having a plurality of serially-coupled latches, wherein at any given time, one of the serially-coupled latches is configured to output a selection signal to a correspondingly switch of the one-hot multiplexer circuit, and wherein a remainder of the serially-coupled latches are inhibited from providing a corresponding selection signal at the given time.

6. The apparatus of claim 1, wherein the input data is ternary data.

7. The apparatus of claim 1, wherein the clock generator circuit is configured to generate the first clock signal by dividing the second clock signal.

8. The apparatus of claim 1, wherein, for a given set of input data, N of the parallel processing circuits perform the convolution operation, N being an integer value, and wherein the second frequency is N times the first frequency.

9. The apparatus of claim 1, further comprising a switching power amplifier configured to perform amplitude modulation using the serialized data received from the serializer circuit.

10. The apparatus of claim 1, wherein the function data comprises an impulse response data, at radio frequency, of a filter.

11. A method comprising:
    receiving input data at a processing circuit, the processing circuit comprising a plurality of parallel processing circuits, wherein the input data is synchronized to a first clock signal having a first frequency;
    performing, in the parallel processing circuits, a convolution operation using the input data and data corresponding to an impulse function;
    generating serialized output data, wherein generating the serialized output data comprises a serializer receiving parallel data from the parallel processing circuits and converting the data to a serial format; and
    outputting the serialized output data in accordance with a second clock signal having a second frequency that is an integer multiple of the first frequency.

12. The method of claim 11, wherein generating serialized output data comprises a one-hot multiplexer selecting outputs from the parallel processing circuits.

13. The method of claim 12, further comprising a selection circuit causing the one-hot multiplexer to select output from the parallel processing circuits sequentially.

14. The method of claim 11, wherein receiving input data comprises receiving ternary data symbols at a data rate corresponding to the first clock frequency, and wherein performing the convolution operation comprises performing a dot product between each ternary data symbol and a portion of the impulse function.

15. The method of claim 11, wherein the second frequency is a radio frequency for a carrier signal used to wirelessly transmit the serialized output data, and wherein the method further comprises:
    providing, at the radio frequency, the serialized data to a power amplifier;
    generating an amplitude modulated signal using the serialized data; and
    wirelessly transmitting the amplitude modulated signal.

16. A system comprising:
    a power amplifier configured to amplify signals for wireless transmission;
    a serializer configured to provide signals comprising serialized data, at a radio frequency, to the power amplifier;
    a processing circuit including a memory circuit and a plurality of parallel processing circuits configured to process data in parallel with one another, wherein the parallel processing circuits are configured to perform a convolution operation based on input data and impulse function data accessed from the memory and further configured to provide parallel output data to the serializer, wherein the processing circuit further includes an input circuit configured to provide the data in parallel to the plurality of parallel processing circuits; and
    a clock generator circuit configured to generate a first clock signal based on a second clock signal, the second clock signal having a frequency equal to the radio frequency, and wherein the frequency of the second clock signal is an integer multiple of a frequency the first clock signal, wherein the first clock signal is provided to the input circuit, wherein the input circuit is configured to provide data to the plurality of processing circuits in accordance with the first clock signal.

17. The system as recited in claim 16, wherein the input circuit includes:
 a programmable delay element coupled to receive the first clock signal;
 an interleaved shift register configured to receive data from the programmable delay element and further configured to provide data to the plurality of parallel processing circuits, wherein the data is provided in accordance with phase select signals having a frequency that is one half that of the first clock signal.

18. The system as recited in claim 16, wherein the serializer includes a one-hot multiplexer configured to sequentially select data in accordance with a selection signal received from an integer divider, and wherein the serializer further includes a latch circuit coupled to configured to latch data received from the one-hot multiplexer at a data rate corresponding to the second clock signal.

19. The system as recited in claim 16, wherein the parallel processing circuits are implemented exclusively with combinational logic circuitry.

20. The system as recited in claim 16, wherein, for a given set of input data, N of the parallel processing circuits perform the convolution operation, N being an integer value, and wherein the frequency of the second clock signal is N times that of the first clock signal.

* * * * *